(12) United States Patent
Daibou et al.

(10) Patent No.: US 8,547,737 B2
(45) Date of Patent: Oct. 1, 2013

(54) MAGNETORESISTIVE ELEMENT AND MAGNETIC MEMORY

(71) Applicants: Tadaomi Daibou, Yokohama (JP); Eiji Kitagawa, Yokohama (JP); Yutaka Hashimoto, Kawasaki (JP); Masaru Tokou, Yokohama (JP); Toshihiko Nagase, Yokohama (JP); Katsuya Nishiyama, Yokohama (JP); Koji Ueda, Kamakura (JP); Makoto Nagamine, Tokyo (JP); Tadashi Kai, Tokyo (JP); Hiroaki Yoda, Sagamihara (JP)

(72) Inventors: Tadaomi Daibou, Yokohama (JP); Eiji Kitagawa, Yokohama (JP); Yutaka Hashimoto, Kawasaki (JP); Masaru Tokou, Yokohama (JP); Toshihiko Nagase, Yokohama (JP); Katsuya Nishiyama, Yokohama (JP); Koji Ueda, Kamakura (JP); Makoto Nagamine, Tokyo (JP); Tadashi Kai, Tokyo (JP); Hiroaki Yoda, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/628,724

(22) Filed: Sep. 27, 2012

(65) Prior Publication Data
US 2013/0020659 A1 Jan. 24, 2013

Related U.S. Application Data

(63) Continuation of application No. 13/043,064, filed on Mar. 8, 2011, now Pat. No. 8,305,801.

(30) Foreign Application Priority Data

Sep. 16, 2010 (JP) ................................. 2010-208058

(51) Int. Cl.
*G11C 11/14* (2006.01)
(52) U.S. Cl.
USPC ............ 365/171; 365/148; 365/158; 977/935

(58) Field of Classification Search
USPC ................. 365/48, 55, 62, 66, 74, 78, 80–93, 365/100, 130, 131, 148, 158, 171–173, 209, 365/213, 225.5, 230.07, 232, 243.5; 216/22; 257/421, E21.665; 438/3; 428/810–816, 428/817–825.1, 826; 977/933–935
See application file for complete search history.

(56) References Cited

U.S. PATENT DOCUMENTS 7,596,015 B2 * 9/2009 Kitagawa et al. ............. 365/158
2003/0007398 A1 * 1/2003 Daughton et al. ............ 365/200

(Continued)

FOREIGN PATENT DOCUMENTS

JP 2009-81315 4/2009
JP 2011-61204 3/2011

OTHER PUBLICATIONS

Japanese Office Action issued on Jul. 13, 2012, in Japanese Patent Application No. 2010-208058 filed Sep. 16, 2010 (with English Translation).

(Continued)

*Primary Examiner* — Harry W Byrne
(74) *Attorney, Agent, or Firm* — Oblon, Spivak, McClelland, Maier & Neustadt, L.L.P.

(57) ABSTRACT

A magnetoresistive element according to an embodiment includes: a first ferromagnetic layer having an axis of easy magnetization in a direction perpendicular to a film plane; a second ferromagnetic layer having an axis of easy magnetization in a direction perpendicular to a film plane; a nonmagnetic layer placed between the first ferromagnetic layer and the second ferromagnetic layer; a first interfacial magnetic layer placed between the first ferromagnetic layer and the nonmagnetic layer; and a second interfacial magnetic layer placed between the second ferromagnetic layer and the nonmagnetic layer. The first interfacial magnetic layer includes a first interfacial magnetic film, a second interfacial magnetic film placed between the first interfacial magnetic film and the nonmagnetic layer and having a different composition from that of the first interfacial magnetic film, and a first nonmagnetic film placed between the first interfacial magnetic film and the second interfacial magnetic film.

18 Claims, 8 Drawing Sheets

(56) References Cited

U.S. PATENT DOCUMENTS

| | | | |
|---|---|---|---|
| 2003/0048676 | A1 | 3/2003 | Daughton et al. |
| 2004/0013880 | A1 | 1/2004 | Daughton et al. |
| 2004/0061154 | A1* | 4/2004 | Huai et al. .............. 257/295 |
| 2005/0118458 | A1* | 6/2005 | Slaughter et al. ......... 428/692 |
| 2006/0018057 | A1* | 1/2006 | Huai ...................... 360/324.2 |
| 2007/0019337 | A1* | 1/2007 | Apalkov et al. ......... 360/324.1 |
| 2007/0096229 | A1* | 5/2007 | Yoshikawa et al. ........ 257/421 |
| 2007/0297220 | A1* | 12/2007 | Yoshikawa et al. ........ 365/158 |
| 2008/0164547 | A1* | 7/2008 | Higo et al. ................ 257/421 |
| 2008/0225583 | A1* | 9/2008 | Guo et al. ................. 365/173 |
| 2008/0310214 | A1* | 12/2008 | Wang et al. .............. 365/158 |
| 2009/0027810 | A1* | 1/2009 | Horng et al. ............ 360/324.2 |
| 2009/0080124 | A1* | 3/2009 | Yoshikawa et al. ..... 360/324.12 |
| 2010/0080050 | A1* | 4/2010 | Ozeki et al. .............. 365/158 |
| 2011/0228596 | A1 | 9/2011 | Inokuchi et al. |

OTHER PUBLICATIONS

M. Oogane, et al., "Measurement of Magnetic Damping Parameters in Co-Fe-B Thin Films", Journal of the Magnetics Society of Japan, vol. 31, No. 3, May 1, 2007, pp. 209-212.

W.H. Butler et al., "Spin-dependent tunneling conductance of Fe|MgO|Fe sandwiches", The American Physical Society, Physical Review B., vol. 63, 2001, 12 pages.

Koji Tsunekawa et al., "Influence of Chemical Compositioin of CoFeB on Tunneling Magnetoresistance and Microstructure in Polycrystalline CoFeB/MgO/CoFeB Magnetic Tunnel Junctions", Japanese Journal of Applied Physics, vol. 45, No. 43, 2006, pp. L1152-L1155.

* cited by examiner

MAGNETORESISTIVE ELEMENT AND MAGNETIC MEMORY

CROSS-REFERENCE TO RELATED APPLICATION

This application is a continuation of U.S. application Ser. No. 13/043,064 filed Mar. 8, 2011, and is based upon and claims the benefit of priority from prior Japanese Patent Application No. 2010-208058 filed on Sep. 16, 2010 in Japan, the entire contents of each of which are incorporated herein by reference.

FIELD

Embodiments described herein relate generally to a magnetoresistive element and a magnetic memory.

BACKGROUND

It is known that a MTJ (Magnetic Tunnel Junction) element serving as a magnetoresistive element has a stacked structure as a basic structure, and shows a tunneling magnetoresistive (TMR) effect. The stacked structure is formed by a first ferromagnetic layer, a tunnel barrier layer, and a second ferromagnetic layer. Such MTJ elements are used in 100-Mbpsi (bits per square inch) HDD heads and magnetic random access memories (MRAMs).

A MRAM characteristically stores information ("1", "0") corresponding to changes in the relative angle of the magnetizations of magnetic layers in each MTJ element, and therefore, is nonvolatile. A magnetization switching speed is several nanoseconds, and accordingly, high-speed data writing and reading can be performed. In view of this, MRAMs are expected to be the next generation of high-speed nonvolatile memories. Where a spin torque transfer switching technique for controlling magnetization through a spin-polarized current is utilized, the current density becomes higher when the cell size of the MRAM is made smaller. Accordingly, a high-density, low-power-consumption MRAM that can readily invert the magnetization of a magnetic material can be formed.

Furthermore, it has been recently theoretically proved that the use of MgO for the tunnel barrier layer leads to a magnetoresistance ratio of as high as 1000%, which has been drawing attention. Specifically, by crystallizing MgO, only the electrons having a certain wavenumber can selectively tunnel from the ferromagnetic layers while maintaining the wavenumber. At this point, the spin polarizability has a large value in a certain crystal orientation, and as a result, a giant magnetoresistive effect is caused. Therefore, an increase in the magnetoresistive effect of each MTJ element leads directly to a higher density and lower power consumption of the MRAM.

To achieve a higher-density nonvolatile memory, higher integration of magnetoresistive elements is essential. In the ferromagnetic materials forming the magnetoresistive elements, however, thermal disturbance resistance characteristics become lower as the element size becomes smaller. Therefore, how to increase the magnetic anisotropy and thermal disturbance resistance characteristics of a ferromagnetic material remains a challenge.

To solve the above problem, test MRAMs have been produced recently with the use of perpendicular magnetization MTJ elements in which the magnetization direction of each ferromagnetic material is perpendicular to the film plane. In a perpendicular magnetization MTJ element, a material with large crystalline magnetic anisotropy is normally used for a ferromagnetic material. Such a material has magnetization oriented in a certain crystalline direction, and the size of the crystal magnetic anisotropy can be controlled by varying composition ratio and crystallinity of the constituent element. Therefore, the magnetization direction can be controlled by switching the crystal growth direction. As a ferromagnetic material has high crystal magnetic anisotropy, the aspect ratio of the element can be set at 1. Further, having high thermal disturbance resistance characteristics, such a material is suitable for high integration. In view of this, forming perpendicular magnetization MTJ elements each having a great magnetoresistive effect is essential in realizing a high-integration, low-power-consumption MRAM.

DETAILED DESCRIPTION

The following is a description of embodiments of the present invention, with reference to the accompanying drawings. It should be noted that, in the following description, components having like functions and structures are denoted by like reference numerals, and explanation of them is not repeated unless it is necessary.

A magnetoresistive element according to an embodiment includes: a first ferromagnetic layer having an axis of easy magnetization in a direction perpendicular to a film plane; a second ferromagnetic layer having an axis of easy magnetization in a direction perpendicular to a film plane; a nonmagnetic layer placed between the first ferromagnetic layer and the second ferromagnetic layer; a first interfacial magnetic layer placed between the first ferromagnetic layer and the nonmagnetic layer; and a second interfacial magnetic layer placed between the second ferromagnetic layer and the nonmagnetic layer. The first interfacial magnetic layer includes a first interfacial magnetic film, a second interfacial magnetic film placed between the first interfacial magnetic film and the nonmagnetic layer and having a different composition from that of the first interfacial magnetic film, and a first nonmagnetic film placed between the first interfacial magnetic film and the second interfacial magnetic film, and a magnetization direction of one of the first ferromagnetic layer and the second ferromagnetic layer may be changable by a current flowing between the first ferromagnetic layer and the second ferromagnetic layer through the nonmagnetic layer.

(First Embodiment)

Figure 1:
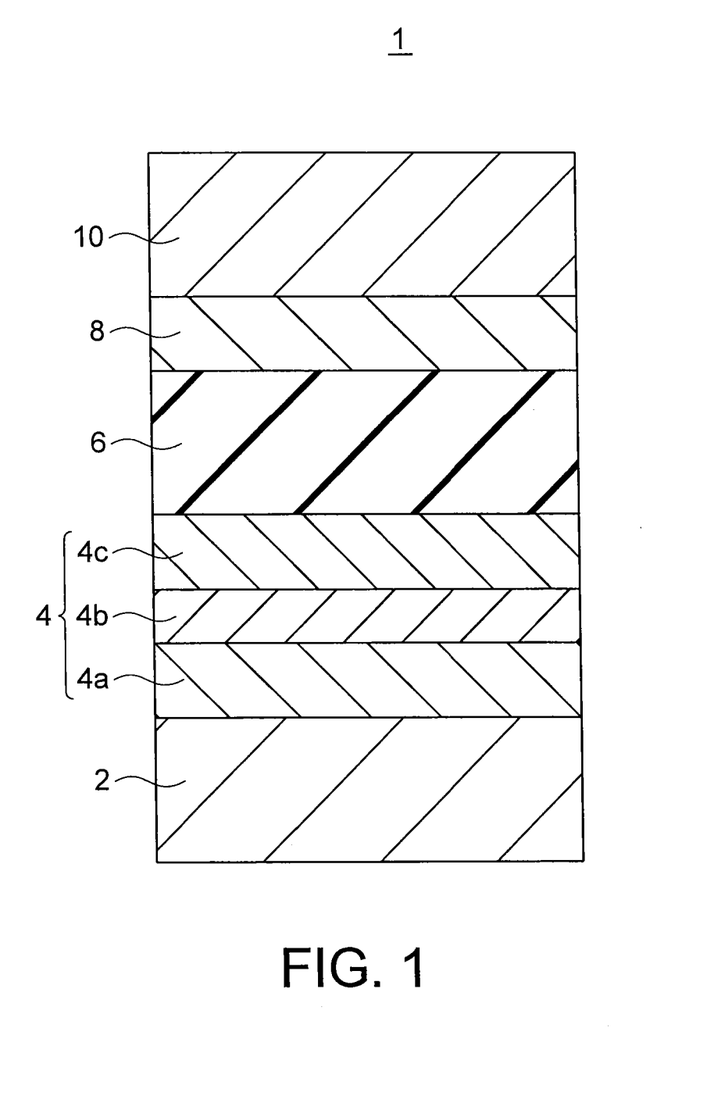
FIG. 1 is a cross-sectional view of a magnetoresistive element according to a first embodiment.

FIG. 1 shows a magnetoresistive element of a first embodiment. FIG. 1 is a cross-sectional view of the magnetoresistive element 1 of the first embodiment. The magnetoresistive element 1 of this embodiment is a MTJ element, and has a structure in which a first ferromagnetic layer 2, a first interfacial magnetic layer 4, a nonmagnetic layer (a tunnel barrier layer) 6, a second interfacial magnetic layer 8, and a second ferromagnetic layer 10 are stacked in this order. It should be noted that the stacking order may be inverted. That is, the second ferromagnetic layer 10, the second interfacial magnetic layer 8, the nonmagnetic layer 6, the first interfacial magnetic layer 4, and the first ferromagnetic layer 2 may be stacked in this order. In this embodiment, the first interfacial magnetic layer 4 has a stacked structure formed by an interfacial magnetic film 4a, a nonmagnetic film 4b, and an interfacial magnetic film 4c. The interfacial magnetic film 4a is provided near by the first ferromagnetic layer 2, and the interfacial magnetic film 4c is provided near by the nonmagnetic layer 6.

The first and second ferromagnetic layers 2 and 10 each have magnetic anisotropy in a direction perpendicular to the corresponding film plane, and each of the easy magnetization directions of the first and second ferromagnetic layers 2 and 10 is perpendicular to the corresponding film plane. That is, the MTJ element 1 of this embodiment is a so-called perpendicular magnetization MTJ element, with the magnetization directions of the first and second ferromagnetic layers 2 and 10 being perpendicular to the respective film planes. In this specification, a film plane is the upper face of a ferromagnetic layer. An easy magnetization direction is a direction in which the spontaneous magnetization of an assumed macro-size ferromagnetic material is oriented to minimize the internal energy while there are no external magnetic fields. On the other hand, a hard magnetization direction is a direction in which the spontaneous magnetization of an assumed macro-size ferromagnetic material is oriented to maximize the internal energy while there are no external magnetic fields. When a write current is applied to the MTJ element 1, the magnetization direction of one of the first and second ferromagnetic layers 2 and 10 does not vary before and after writing, and the magnetization direction of the other one of the first and second ferromagnetic layers 2 and 10 may vary before and after writing. The ferromagnetic layer having the unvarying magnetization direction is also referred to as a reference layer, and the ferromagnetic layer having the varying magnetization direction is referred to as a recording layer. In this embodiment, the first ferromagnetic layer 2 is a recording layer, and the second ferromagnetic layer 10 is a reference layer, for example.

The write current flows between the first ferromagnetic layer 2 and the second ferromagnetic layer 10 in a direction perpendicular to the film planes. In a case where the first ferromagnetic layer 2 is a recording layer, the second ferromagnetic layer is a reference layer, and the magnetization direction of the first ferromagnetic layer 2 and the magnetization direction of the second ferromagnetic layer 10 are antiparallel to each other (the opposite directions from each other), a write current is applied in the direction from the first ferromagnetic layer 2 toward the second ferromagnetic layer 10. In this case, electrons flow from the second ferromagnetic layer 10 to the first ferromagnetic layer 2 through the nonmagnetic layer 6. The electrons spin-polarized in the second ferromagnetic layer 10 flow into the first ferromagnetic layer 2. While the spin-polarized electrons having spins in the same direction as the magnetization of the first ferromagnetic layer 2 pass through the first ferromagnetic layer 2, the spin-polarized electrons having spins in the opposite direction from the magnetization of the first ferromagnetic layer 2 apply spin torque to the magnetization of the first ferromagnetic layer 2 to orient the magnetization direction of the first ferromagnetic layer 2 to the same direction as the magnetization of the second ferromagnetic layer 10. Accordingly, the magnetization direction of the first ferromagnetic layer 2 is inverted, and becomes parallel to (or the same as) the magnetization direction of the second ferromagnetic layer 10.

In a case where the magnetization direction of the first ferromagnetic layer 2 and the magnetization direction of the second ferromagnetic layer 10 are parallel to each other, a write current flows from the second ferromagnetic layer 10 to the first ferromagnetic layer 2. In this case, electrons flow from the first ferromagnetic layer 2 to the second ferromagnetic layer 10 through the nonmagnetic layer 6. The electrons spin-polarized in the first ferromagnetic layer 2 flow into the second ferromagnetic layer 10. While the spin-polarized electrons having spins in the same direction as the magnetization of the second ferromagnetic layer 10 pass through the second ferromagnetic layer 10, the spin-polarized electrons having spins in the opposite direction from the magnetization of the second ferromagnetic layer 10 are reflected by the interface between the nonmagnetic layer 6 and the second ferromagnetic layer 10, and flow into the first ferromagnetic layer 2 through the nonmagnetic layer 6. The spin-polarized electrons having spins in the opposite direction from the magnetization of the second ferromagnetic layer 10 then apply spin torque to the magnetization of the first ferromagnetic layer 2 to orient the magnetization direction of the first ferromagnetic layer 2 to the opposite direction from the magnetization of the second ferromagnetic layer 10. Accordingly, the magnetization direction of the first ferromagnetic layer 2 is inverted, and becomes antiparallel to the magnetization direction of the second ferromagnetic layer 10.

The first and second interfacial magnetic layers 4 and 8 are provided to increase the spin polarizability. The nonmagnetic film 4b is inserted to the first interfacial magnetic layer 4, and the compositions of the interfacial magnetic films 4a and 4c sandwiching the nonmagnetic film 4b are adjusted to provide different functions to the interfacial magnetic films 4a and 4c in an active manner. For example, the interfacial magnetic film 4c adjacent to the tunnel barrier layer 6 made of MgO has high spin polarizability, and adjusts to the crystal structure of a body-centered cubic (BCC) structure. Having the crystal structure of a BCC structure, the adjusted interfacial magnetic film 4c has small lattice mismatching with the tunnel barrier layer 6 made of MgO, and accordingly, high magnetoresistance can be achieved. On the other hand, the interfacial magnetic film 4a adjusts its crystal structure so that the lattice mismatching with the adjacent first ferromagnetic layer 2 having perpendicular magnetization becomes smaller. With this arrangement, the crystallinity of the first ferromagnetic layer 2 having perpendicular magnetization is not greatly affected, even if the interfacial magnetic film 4a is crystallized through a heat treatment. Accordingly, even when a high-temperature heat treatment is performed, high magnetic anisotropy can be maintained, and the magnetoresistance ratio can be made higher. In this manner, the nonmagnetic film 4b separates the crystals in the interfacial magnetic film 4a from the crystals in the interfacial magnetic film 4c.

As described above, the interfacial magnetic films 4c and 4a adjacent to the tunnel barrier layer 6 made of MgO and the first ferromagnetic layer 2, respectively, are optimized, so that high spin polarizability and thermal stability of the first ferromagnetic layer 2 having perpendicular magnetization can be both achieved. Accordingly, a magnetoresistive element having high thermal tolerance can be formed. That is, it is possible to obtain a magnetoresistive element that has perpendicular magnetic anisotropy and is capable of exhibiting a greater magnetoresistive effect.

(Second Embodiment)

Figure 2:
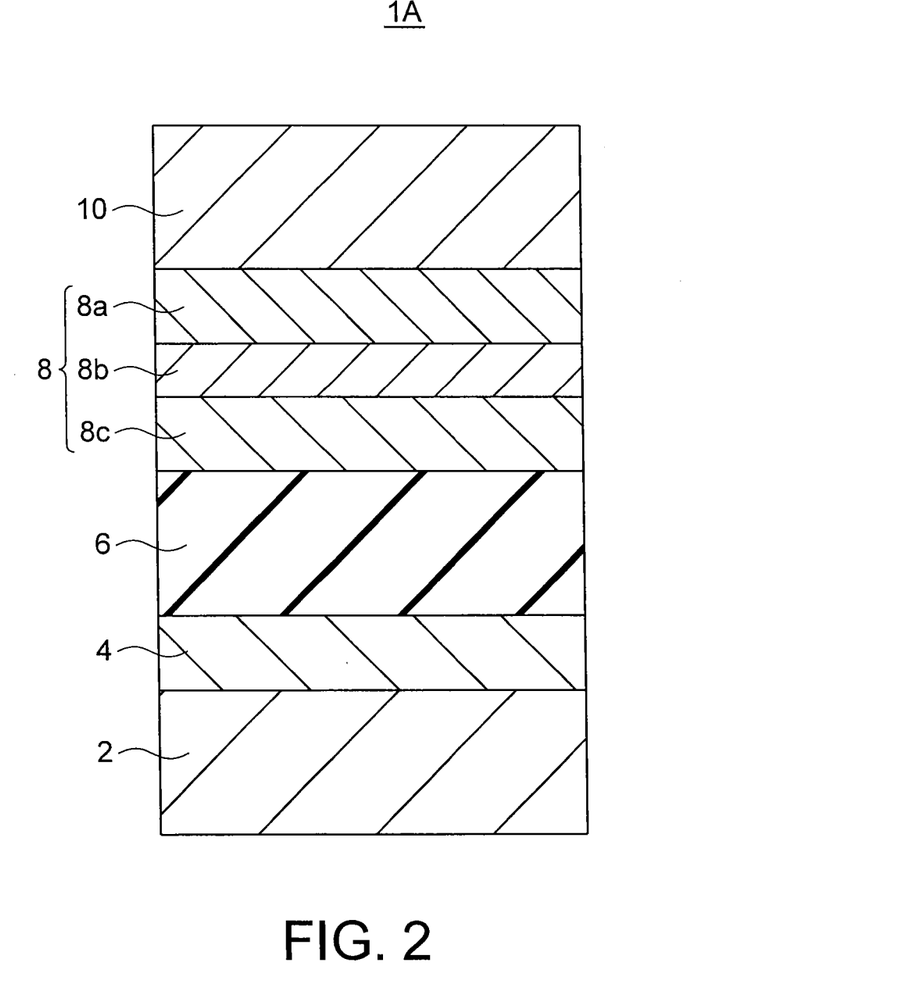
FIG. 2 is a cross-sectional view of a magnetoresistive element according to a second embodiment.

FIG. 2 shows a magnetoresistive element according to a second embodiment. FIG. 2 is a cross-sectional view of the magnetoresistive element 1A of the second embodiment. The magnetoresistive element 1A of this embodiment is a MD element, and has a structure in which a first ferromagnetic layer 2, a first interfacial magnetic layer 4, a nonmagnetic layer (a tunnel barrier layer) 6, a second interfacial magnetic layer 8, and a second ferromagnetic layer 10 are stacked in this order. It should be noted that the stacking order may be inverted. That is, the second ferromagnetic layer 10, the second interfacial magnetic layer 8, the nonmagnetic layer 6, the first interfacial magnetic layer 4, and the first ferromagnetic layer 2 may be stacked in this order. In this embodiment, the second interfacial magnetic layer 8 has a stacked structure formed by an interfacial magnetic film 8a, a nonmagnetic film 8b, and an interfacial magnetic film 8c. The interfacial magnetic film 8a is provided near by the second ferromagnetic layer 10, and the interfacial magnetic film 8c is provided near by the nonmagnetic layer 6.

As in the first embodiment, the first and second ferromagnetic layers 2 and 10 each have magnetic anisotropy in a direction perpendicular to the corresponding film plane, and each of the easy magnetization directions of the first and second ferromagnetic layers 2 and 10 is perpendicular to the corresponding film plane. That is, the MD element 1A of this embodiment is a so-called perpendicular magnetization MTJ element, with the magnetization directions of the first and second ferromagnetic layers 2 and 10 being perpendicular to the respective film planes. When a write current is applied to the MTJ element 1A, the magnetization direction of one of the first and second ferromagnetic layers 2 and 10 does not vary before and after writing, and the magnetization direction of the other one of the first and second ferromagnetic layers 2 and 10 may vary before and after writing. In this embodiment, the first ferromagnetic layer 2 is a reference layer, and the second ferromagnetic layer 10 is a recording layer, for example. It should be noted that the write current is applied between the first ferromagnetic layer 2 and the second ferromagnetic layer 10 in a direction perpendicular to the film planes as in the first embodiment.

As in the first embodiment, the first and second interfacial magnetic layers 4 and 8 are provided to increase the spin polarizability. The nonmagnetic film 8b is inserted to the second interfacial magnetic layer 8, and the compositions of the interfacial magnetic films 8a and 8c sandwiching the nonmagnetic film 8b are adjusted to provide different functions to the interfacial magnetic films 8a and 8c in an active manner. For example, the interfacial magnetic film 8c adjacent to the tunnel barrier layer 6 made of MgO has high spin polarizability, and adjusts to the crystal structure of a body-centered cubic (BCC) structure. Having the crystal structure of a BCC structure, the adjusted interfacial magnetic film 8c has small lattice mismatching with the tunnel barrier layer 6 made of MgO, and accordingly, high magnetoresistance can be achieved. On the other hand, the interfacial magnetic film 8a adjusts its crystal structure so that the lattice mismatching with the adjacent second ferromagnetic layer 10 having perpendicular magnetization becomes smaller. With this arrangement, the crystallinity of the second ferromagnetic layer 10 having perpendicular magnetization is not greatly affected, even if the interfacial magnetic film 8a is crystallized through a heat treatment. Accordingly, even when a high-temperature heat treatment is performed, high magnetic anisotropy can be maintained, and the magnetoresistance ratio can be made higher. In this manner, the nonmagnetic film 8b separates the crystals in the interfacial magnetic film 8a from the crystals in the interfacial magnetic film 8c.

As described above, the interfacial magnetic films 8c and 8a adjacent to the tunnel barrier layer 6 made of MgO and the second ferromagnetic layer 10, respectively, are optimized, so that high spin polarizability and thermal stability of the second ferromagnetic layer 10 having perpendicular magnetization can be both achieved. Accordingly, a magnetoresistive element having high thermal tolerance can be formed. That is, it is possible to obtain a magnetoresistive element that has perpendicular magnetic anisotropy and is capable of exhibiting a greater magnetoresistive effect.

(Third Embodiment)

Figure 3:
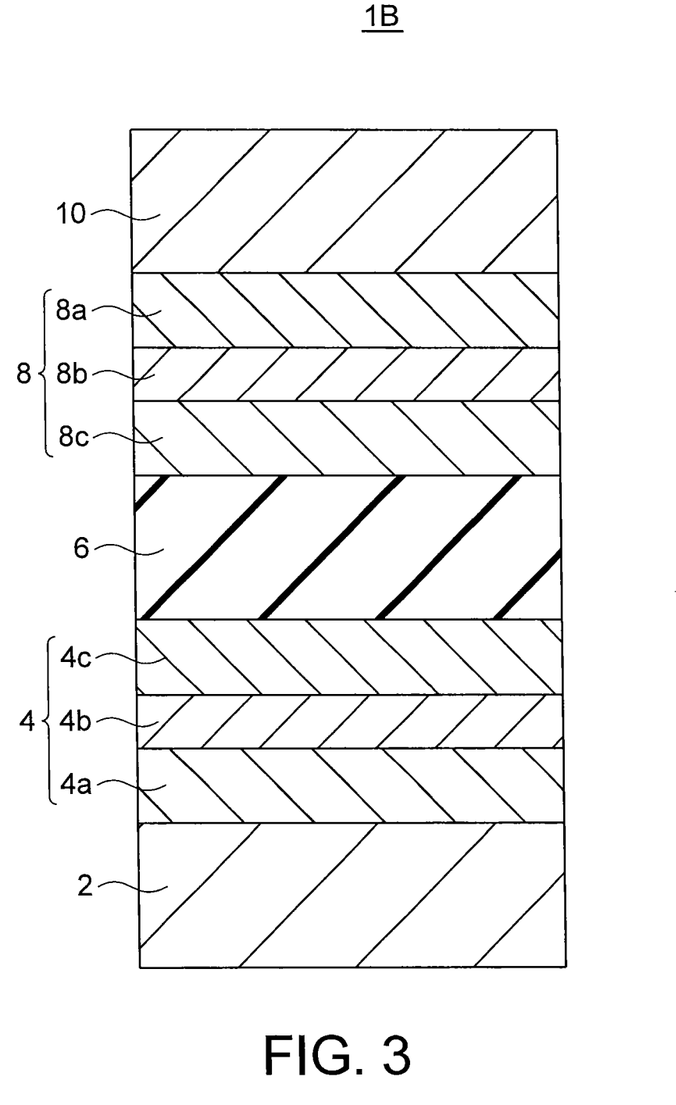
FIG. 3 is a cross-sectional view of a magnetoresistive element according to a third embodiment.

FIG. 3 shows a magnetoresistive element according to a third embodiment. FIG. 3 is a cross-sectional view of the magnetoresistive element 1B of the third embodiment. The magnetoresistive element 1B of this embodiment is the same as the MTJ element 1 shown in FIG. 1, except that a stacked structure formed by an interfacial magnetic film 8a, a nonmagnetic film 8b, and an interfacial magnetic film 8c is used as the second interfacial magnetic layer 8 as in the second embodiment. The interfacial magnetic film 8a is provided on a side of the second ferromagnetic layer 10 nearest to the nonmagnetic film 8b, and the interfacial magnetic film 8c is provided on a side of the nonmagnetic layer 6 nearest to the nonmagnetic film 8b.

In the third embodiment, the compositions of the interfacial magnetic films 4a and 4c and the compositions of the interfacial magnetic films 8a and 8c are appropriately adjusted, so that high spin polarizability and thermal stability of the second ferromagnetic layer 10 having perpendicular magnetization can be both achieved, as in the first and second embodiments. Accordingly, a magnetoresistive element having high thermal tolerance can be formed. That is, it is possible to obtain a magnetoresistive element that has perpendicular magnetic anisotropy and is capable of exhibiting a greater magnetoresistive effect.

The structures of the respective layers included in the MTJ elements 1, 1A, and 1B of the first through third embodiments are now described in detail in the following order: the first ferromagnetic layer 2, the second ferromagnetic layer 10, the first interfacial magnetic layer 4, the second interfacial magnetic layer 8, and the nonmagnetic layer 6.

(First Ferromagnetic Layer 2 and Second Ferromagnetic Layer 10)

A material having perpendicular magnetic anisotropy is used for each first ferromagnetic layer 2 of the first and third embodiments and each second ferromagnetic layer 10 of the second and third embodiments. For example, a metal that has crystals oriented to (111) of a face-centered cubic (FCC) structure or (001) of a hexagonal closest packing (HCP) structure, or a metal that can form an artificial lattice is used. Examples of metals having crystals oriented to (111) of a FCC or (001) of a HCP include alloys each containing one or more elements selected from the first group consisting of Fe, Co, Ni, and Cu, and one or more elements selected from the second group consisting of Pt, Pd, Rh, and Au. Specifically, a ferromagnetic alloy such as CoPd, CoPt, NiCo, or NiPt may be used.

The artificial lattice used in the first ferromagnetic layers 2 in the first and third embodiments or the second ferromagnetic layers 10 in the second and third embodiments may be a structure in which one or more elements selected from the group consisting of Fe, Co, and Ni or an alloy (a ferromagnetic film) containing the one element, and one element selected from the group consisting of Cr, Pt, Pd, Ir, Rh, Ru, Os, Re, Au, and Cu or an alloy (a nonmagnetic film) containing the one element are alternately stacked. Examples of such artificial lattices include a Co/Pt artificial lattice, a Co/Pd artificial lattice, a CoCr/Pt artificial lattice, a Co/Ru artificial lattice, a Co/Os artificial lattice, a Co/Au artificial lattice, and a Ni/Cu artificial lattice. In each of those artificial lattices, the magnetic anisotropy energy density and the saturation magnetization can be controlled by adjusting the amount of element to be added to the ferromagnetic film and the film thickness ratio between the ferromagnetic film and the nonmagnetic film.

The second ferromagnetic layer 10 in the first embodiment and the first ferromagnetic layer 2 used in the second embodiment have perpendicular magnetic anisotropy. An amorphous metal or a metal that has crystals oriented to (001) of a body-centered cubic (BCC) structure or (001) of a body-centered tetragonal (BCT) structure is used for the second ferromagnetic layer 10 in the first embodiment or the first ferromagnetic layer 2 used in the second embodiment.

The amorphous metal that is used for the second ferromagnetic layer 10 in the first embodiment and the first ferromagnetic layer 2 used in the second embodiment may be a ferrimagnetic material made of an alloy of a rare earth metal and a transition metal, or an amorphous alloy containing at least one element selected from the group consisting of Fe, Co, Ni, Tb, Dy, and Gd. Examples of such alloys include TbFe, TbCo, TbFeCo, DyTbFeCo, and GdTbCo. Alternatively, a multilayer structure in which those alloys are alternately stacked may be used. Specific examples of such multilayer films include TbFe/Co, TbCo/Fe, TbFeCo/CoFe, DyFe/Co, DyCo/Fe, and DyFeCo/CoFe. In each of those alloys, the magnetic anisotropy energy density and the saturation magnetization can be controlled by adjusting the composition.

The metal that has crystals oriented to (001) of a BCC or (001) of a BCT and is used for the second ferromagnetic layer 10 in the first embodiment and the first ferromagnetic layer 2 used in the second embodiment may be an alloy containing one or more element selected from the first group consisting of Fe, Co, Ni, and Cu, and one or more elements selected from the second group consisting of Pt, Pd, Rh, and Au. Specific examples of such alloys include ferromagnetic alloys such as FeRh, FePt, FePd, and CoPt.

(First Interfacial Magnetic Layer 4 and Second Interfacial Magnetic Layer 8)

The first interfacial magnetic layer 4 includes the nonmagnetic film 4b, and further includes the interfacial magnetic film 4c adjacent to the nonmagnetic layer 6 and the interfacial magnetic film 4a adjacent to the first ferromagnetic layer 2. The second interfacial magnetic layer 8 includes the nonmagnetic film 8b, and further includes the interfacial magnetic film 8c adjacent to the nonmagnetic layer 6 and the interfacial magnetic film 8a adjacent to the second ferromagnetic layer 10.

<Interfacial Magnetic Film 4c and Interfacial Magnetic Film 8c>

To increase the magnetoresistance ratio of the element, a material having high spin polarizability is normally used for the interfacial magnetic layer adjacent to the tunnel barrier layer (the nonmagnetic layer) 6 made of MgO. Therefore, the interfacial magnetic film 4c and the interfacial magnetic film 8c are preferably made of an alloy containing at least one metal selected from the group consisting of Fe and Co. The interfacial magnetic film 4c and the interfacial magnetic film 8c preferably have such an orientation that the interface in contact with the nonmagnetic layer 6 is a (001) plane of a BCC structure. For example, having a crystal structure that varies with compositions, a CoFe alloy should preferably be $Co_xFe_{100-x}$ (x≤75 atomic %), which falls within a composition range in which a CoFe alloy can have a stable BCC structure. The interfacial magnetic film 4c and the interfacial magnetic film 8c each having a (001) plane of a BCC structure as the interface in contact with the nonmagnetic layer 6 can have MgO (001)-oriented in a direction perpendicular to the film planes, if the nonmagnetic layer 6 made of MgO is grown on CoFe. For example, in a case where an interfacial magnetic layer made of CoFe, a nonmagnetic layer made of MgO, and another interfacial magnetic layer made of CoFe are formed, an epitaxial relationship of CoFe (001)/MgO (001)/CoFe (001) can be established. In this case, the wavenumber selectivity of tunneling electrons can be increased, and accordingly, a higher magnetoresistance ratio can be achieved. Even if the interfacial magnetic films 4c and 8c expand and contract in the direction perpendicular to the film planes, a high magnetoresistance ratio can be obtained, as long as (001)-oriented epitaxial growth is performed with respect to MgO. Therefore, the interfacial magnetic films 4c and 8c in contact with the nonmagnetic layer 6 may be BCT structures. Also, to control the lattice constant of the CoFe alloy, at least one element selected from the group consisting of Ni, B, C, P, Mo, Si, W, Nb, Mn, and Ge may be added to the CoFe alloy. That is, each of the interfacial magnetic films 4c and 8c may be an alloy containing at least one element selected from the group consisting of Fe and Co, and at least one element selected from the group consisting of Ni, B, C, P, Mo, Si, W, Mn, Ge, and Nb. Examples of such alloys other than CoFeB include CoFeSi, CoFeP, CoFeW, and CoFeNb, and each of those alloys has the same spin polarizability as that of CoFeB. Each of the interfacial magnetic films 4c and 8c may be a Heusler metal such as $Co_2FeSi$, $Co_2MnSi$, or $Co_2MnGe$. Having the same spin polarizability as or higher spin polarizability than that of CoFeB, a Heusler metal is suitable for an interfacial magnetic layer.

<Interfacial Magnetic Film 4a and Interfacial Magnetic Film 8a>

Each of the interfacial magnetic film 4a adjacent to the first ferromagnetic layer 2 and the interfacial magnetic film 8a adjacent to the second ferromagnetic layer 10 is preferably made of an alloy containing at least one metal selected from the group consisting of Fe and Co. In a case where the first ferromagnetic layer 2 is a CoPd alloy, and the CoPd has a (111) orientation of a FCC structure or a (001) orientation of a HCP structure in the direction perpendicular to the film planes, a perpendicular magnetization film having magnetization in the normal direction of the film plane is formed. Therefore, in a case where a CoFe alloy is selected for the interfacial magnetic film 4a or the interfacial magnetic film 8a, for example, the lattice mismatching with the first ferromagnetic layer 2 or the second ferromagnetic layer 10 made of CoPd should preferably be small. If the lattice mismatching is large, a dislocation is caused in the interface between the first ferromagnetic layer 2 or the second ferromagnetic layer 10 made of CoPd and the interfacial magnetic film 4a or the interfacial magnetic film 8a made of CoFe, to reduce the strain energy of the lattice. As a result, the magnetic anisotropy becomes smaller. Since a CoFe alloy has a crystal structure that varies with compositions, the composition is preferably $Co_yFe_{100-y}$ (y>75 atomic %), which falls within a composition range in which a CoFe alloy can have a stable FCC structure. As the interfacial magnetic film 4a or the interfacial magnetic film 8a made of CoFe, which has a similar crystal structure to that of the first ferromagnetic layer 2 or the second ferromagnetic layer 10 made of CoPd, is stacked on the first ferromagnetic layer 2 or the second ferromagnetic layer 10, the crystal structure of the first ferromagnetic layer 2 or the second ferromagnetic layer 10 made of CoPd can be stabilized. Also, as the interfacial magnetic film 4a or the interfacial magnetic film 8a made of CoFe is adjacent to the first ferromagnetic layer 2 or the second ferromagnetic layer 10, the elements contained in the nonmagnetic film 4b or the nonmagnetic film 8b can be prevented from diffusing into the first ferromagnetic layer 2 or the second ferromagnetic layer 10 made of CoPd. Accordingly, even when a heat treatment is performed at a high temperature, the magnetic anisotropy of the first ferromagnetic layer 2 or the second ferromagnetic layer 10 made of CoPd is not degraded, and desired magnetic anisotropy can be maintained. Like the interfacial magnetic films 4c and 8c, each of the interfacial magnetic films 4a and 8a may be an alloy containing at least one element selected from the group consisting of Fe and Co, and at least one element selected from the group consisting of Ni, B, C, P, Mo, Si, W, Mn, Ge, and Nb.

<Nonmagnetic Film 4b and Nonmagnetic Film 8b>

To achieve a great magnetoresistive effect by utilizing the wavenumber selectivity in a magnetoresistive element using the tunnel barrier layer 6 made of MgO, it is essential that the epitaxial relationship, CoFe (001)/MgO (001)/CoFe (001), is established, for example. In a case where CoPd is used for the first ferromagnetic layer 2 or the second ferromagnetic layer 10, however, the CoPd has a (111) orientation of a FCC structure or a (001) orientation of a HCP structure. Further, the CoFe alloy forming the interfacial magnetic film adjacent to the ferromagnetic layer has a composition with a stable (111) orientation of a FCC structure. Therefore, to establish the epitaxial relationship, CoFe (001)/MgO (001)/CoFe (001), the crystal structure of the interfacial magnetic film 4a or the interfacial magnetic film 8a is separated by the nonmagnetic film 4b or the nonmagnetic film 8b having a film thickness of several angstroms. The nonmagnetic film 4b or the nonmagnetic film 8b is preferably extremely thin and has a microcrystal or amorphous structure. The nonmagnetic film 4b or the nonmagnetic film 8b is preferably a metal containing at least one element selected from the group consisting of Ta, W, Nb, V, Si, and Zr. If the film thickness of the nonmagnetic film 8b is too large, the magnetic coupling between the interfacial magnetic film 8c and the interfacial magnetic film 8a becomes weaker. If the film thickness of the nonmagnetic film 4b is too large, the magnetic coupling between the interfacial magnetic film 4c and the interfacial magnetic film 4a becomes weaker. As a result, magnetization cannot be maintained in the direction perpendicular to the film planes. Therefore, the upper limit of the film thickness of the nonmagnetic film 4b or the nonmagnetic film 8b is preferably 1 nm or smaller.

In a case where Ta is used for the nonmagnetic film 4b or the nonmagnetic film 8b, and CoFeB is used for the interfacial magnetic films 4a and 4c or 8a and 8c, the first interfacial magnetic layer 4 of each of the first and third embodiments or the second interfacial magnetic layer 8 of each of the second and third embodiments has a stacked structure of CoFeB/Ta/CoFeB. In this case, the B in the interfacial magnetic film made of CoFeB is attracted to the nonmagnetic film 4b or the nonmagnetic film 8b made of Ta after the magnetoresistive element is manufactured. Accordingly, there is a distribution such that the B concentration becomes higher toward the Ta film. The reason that CoFeB is used for the interfacial magnetic films 4a and 4c or 8a and 8c is that CoFeB is more readily formed than CoFe. As described above, in a case where the interfacial magnetic films 4a and 4c or 8a and 8c are made of CoFeB, the interfacial magnetic film 4c of each of the first and third embodiments and the interfacial magnetic film 8c of each of the second and third embodiments are preferably $(Co_xFe_{100-x})_{100-z}B_z$ (x≤75 atomic %, 0≤z≤30 atomic %), and the interfacial magnetic film 4a of each of the first and third embodiments and the interfacial magnetic film 8a of each of the second and third embodiments are preferably $(Co_yFe_{100-y})_{100-z}B_z$ (y>75 atomic %, 0≤z≤30 atomic %).

The upper limit of the Co content x and the lower limit of the Co content y have already been mentioned. The reason that the upper limit of the B content z is 30 atomic % is that, if the B content z exceeds 30 atomic %, the spin polarizability of CoFeB becomes extremely low.

The nonmagnetic layer 4b or the nonmagnetic layer 8b having a crystal separating function may be a multilayer structure existing in the first interfacial magnetic layer 4 or the second interfacial magnetic layer 8. Being a multilayer structure, the nonmagnetic layer 4b or the nonmagnetic layer 8b has a greater crystal separating effect, and can contribute more efficiently to an increase of the magnetoresistance ratio of the magnetoresistive element. Therefore, in a case where Ta is used for the nonmagnetic film 4b or the nonmagnetic film 8b, the first interfacial magnetic layer 4 of each of the first and third embodiments or the second interfacial magnetic layer 8 of each of the second and third embodiments is preferably a stacked structure of CoFeB/Ta/CoFeB/Ta/CoFeB.

<Nonmagnetic Layer (Tunnel Barrier Layer) 6>

The nonmagnetic layer 6 is made of an insulating material, and therefore, a tunnel barrier layer is used as the nonmagnetic layer 6. The tunnel barrier layer 6 has a cubic crystal structure or a tetragonal crystal structure as a basic lattice structure. To achieve a high magnetoresistance ratio, the degree of orientation of the tunnel barrier layer 6 needs to be made higher, and the tunnel barrier layer 6 is preferably (001)-oriented in the direction perpendicular to the film planes.

The tunnel barrier layer 6 may be made of an oxide having a main component that is an element selected from the group consisting of magnesium (Mg), calcium (Ca), barium (Ba), aluminum (Al), beryllium (Be), strontium (Sr), and titanium (Ti). Specific examples of such oxides include MgO, CaO, BaO, AlO, BeO, SrO, or TiO. The tunnel barrier layer 6 may be a mixed crystal structure made of two or more materials selected from the group consisting of the above mentioned oxides.

The tunnel barrier layer 6 may be either a crystalline material or an amorphous material. In a case where the tunnel barrier layer 6 is crystallized, however, only the electrons having a certain wavenumber selectively tunnel from the ferromagnetic layers while maintaining the wavenumber. Accordingly, the magnetoresistance ratio can be made higher.

In a case where the tunnel barrier layer 6 is crystallized, an epitaxial relationship is maintained in the interface between the spin-polarized interfacial magnetic film 4c and the tunnel barrier layer 6, to reduce the interfacial energy. While the top face of the tunnel barrier layer 6 is oriented to a (001) plane, the interfacial magnetic film 4c is (001)-oriented in the direction perpendicular to the film planes, and in the film in-plane direction, the interfacial magnetic film 4c grows rotating 45 degrees with respect to [001] of the film in-plane direction of the tunnel barrier layer 6.

EXAMPLES

Next, stacked structures of perpendicular magnetization MTJ elements are described in detail as examples. The following magnetoresistive films (samples) were formed, and perpendicular magnetization MTJ elements according to any of the first through third embodiments were formed. The parenthetic numerical values shown after the names of respective layers are the thicknesses (designed values) of the respective layers at the time of film formation. After the film formation, each of the samples is subjected to vacuum annealing at an appropriate temperature for an appropriate period of time so as to optimize TMR properties and magnetic properties.

Example 1

As a perpendicular magnetization MTJ element of Example 1, the perpendicular magnetization MTJ element 1B shown in FIG. 3 was formed. The MTJ element 1B according to Example 1 includes a first ferromagnetic layer 2, a second ferromagnetic layer 10, and a nonmagnetic layer (a tunnel barrier layer) 6 interposed between the first ferromagnetic layer 2 and the second ferromagnetic layer 10. First and second interfacial magnetic layers 4 and 8 for increasing spin polarizability are inserted between the first ferromagnetic layer 2 and the nonmagnetic layer 6, and between the second ferromagnetic layer 10 and the nonmagnetic layer 6, respectively. A nonmagnetic film 4b for separating crystals is further inserted into the first interfacial magnetic layer 4. Also, a nonmagnetic film 8b for separating crystals is inserted into the second interfacial magnetic layer 8. Each of the interfacial magnetic films 4c and 8c in the first and second interfacial magnetic layers 4 and 8 adjacent to the nonmagnetic layer 6 is made of a high-spin-polarizability material, and has a composition adjusted so as to reduce the lattice mismatching, with the nonmagnetic layer 6. The interfacial magnetic film 4a adjacent to the first ferromagnetic layer 2 adjusts the crystal structure so that the lattice mismatching with the first ferromagnetic layer 2 having perpendicular magnetization becomes smaller. Also, the interfacial magnetic film 8a adjacent to the second ferromagnetic layer 10 adjusts the crystal structure so that the lattice mismatching with the second ferromagnetic layer 10 having perpendicular magnetization becomes smaller. Here, a stacked structure formed by Pd (0.2 nm) and Co (0.5 nm) is used as the first ferromagnetic layer 2. The first ferromagnetic layer 2 serves as a recording layer that has perpendicular magnetic anisotropy, an axis of easy magnetization in the perpendicular direction, and has a variable magnetization direction. As the second ferromagnetic layer 10, TbCoFe (16 nm) is used. The second ferromagnetic layer 10 serves as a reference layer that has perpendicular magnetic anisotropy, an axis of easy magnetization in the perpendicular direction, and an invariable magnetization direction. As the nonmagnetic layer 6, a tunnel barrier layer made of MgO is used.

Figure 4:
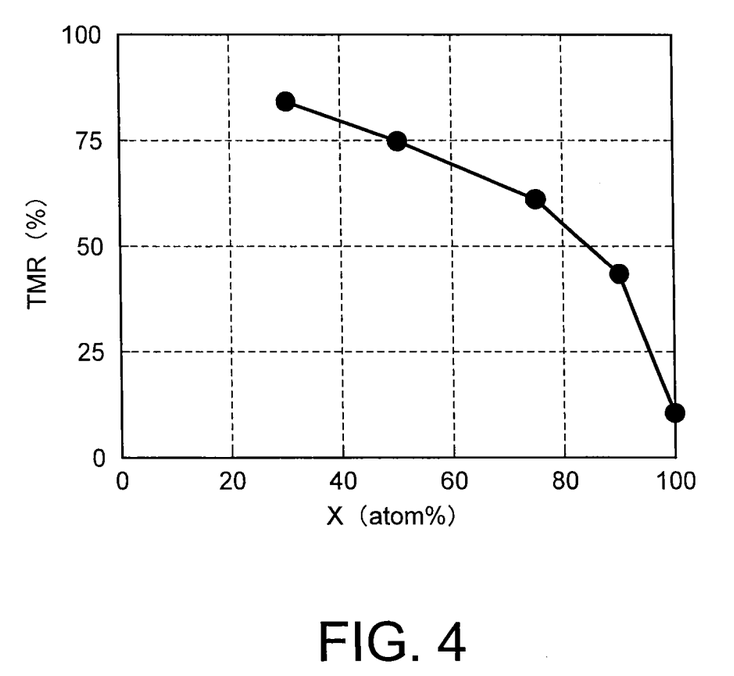
FIG. 4 is a diagram showing the dependence of the magnetoresistance ratio on the Co composition in an interfacial magnetic film.

Ta is used for the nonmagnetic films 4b and 8b, and CoFeB is used for the interfacial magnetic films 4a, 4c, 8a, and 8c. As the interfacial magnetic film 4c, samples that have the composition ratio between Co and Fe in $(Co_xFe_{100-x})_{80}B_{20}$ varying as $0 \leq x \leq 100$ were formed, and the resistance values of the elements were measured, with magnetization being fixed in the direction perpendicular to the film planes of the respective samples. The results are shown in FIG. 4. As can be seen from FIG. 4, as the composition ratio X of Co becomes lower, the magnetoresistance ratio (TMR) becomes higher in the composition range of $Co_xFe_{100-x}$ ($x \leq 75$ atomic %) in which a CoFeB alloy can have a stable BCC structure. An epitaxial relationship is established between the nonmagnetic layer 6 and the interfacial magnetic film 4c having a (001) plane of a BCC structure as the interface in contact with the nonmagnetic layer 6, and the wavenumber selectivity of tunneling electrons can be made higher. It is considered that a high magnetoresistance ratio was achieved for those reasons.

Figure 5:
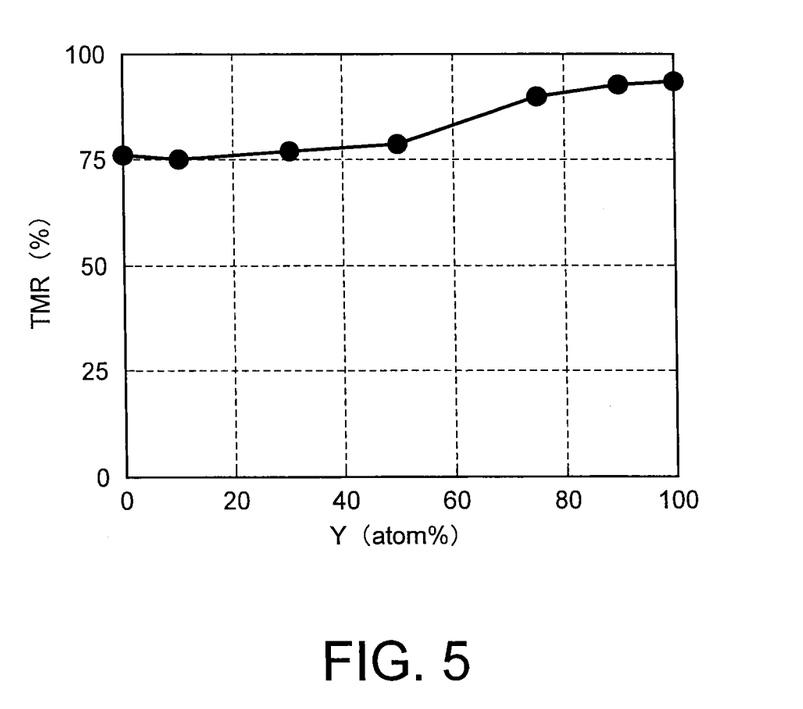
FIG. 5 is a diagram showing the dependence of the magnetoresistance ratio on the Co composition in an interfacial magnetic film.

Next, samples were formed, with the interfacial magnetic film 4c being $Fe_{80}B_{20}$ (0.9 nm) in a composition range in which a CoFeB alloy can have a stable BCC structure, the interfacial magnetic film 4a being $(Co_yFe_{100-y})_{80}B_{20}$ (0.4 nm) having the composition ratio between Co and Fe varying as $0 \leq y \leq 100$. The resistance values of the elements were measured, with magnetization being fixed in the direction perpendicular to the film planes of the respective samples. The results are shown in FIG. 5. As can be seen from FIG. 5, the TMR becomes higher in the composition range of $Co_yFe_{100-y}$ ($y \geq 75$ atomic %) in which a CoFe alloy can have a stable FCC structure. As the lattice mismatching of the interfacial magnetic film 4a having this composition with the first ferromagnetic layer 2 made of CoPd is small, the crystal structure of the first ferromagnetic layer 2 made of CoPd can be stabilized. Furthermore, as the nonmagnetic film 4b has the function to prevent diffusion into the first ferromagnetic layer 2 made of CoPd, the magnetic anisotropy of the first ferromagnetic layer 2 made of CoPd is not degraded even after a heat treatment is performed at a high temperature. Accordingly, the magnetic anisotropy was maintained, and the TMR effect became greater.

In this example, TbCoFe used for the second ferromagnetic layer 10 has an amorphous structure. Therefore, the second interfacial magnetic layer 8 that is stacked on the nonmagnetic layer 6 made of MgO and is made of CoFeB can be crystallized, with the CoFeB being not affected by the crystal structure of the adjacent second ferromagnetic layer 10 in the course of a crystallization accompanied by the heat treatment. Accordingly, the lattice mismatching is small, and an epitaxial relationship with MgO (001) can be maintained. Further, a perpendicular magnetization film that is (001)-oriented in the direction perpendicular to the film planes, such as FePt, FePd, or CoPt, may be used as the second ferromagnetic layer 10. In that case, the second interfacial magnetic layer 8 made of the crystallized CoFeB can maintain an (001) orientation in the direction perpendicular to the film planes, and the epitaxial relationship with MgO (001) can be maintained. Accordingly, in a case where TbCoFe, one of FePt, FePd, and CoPt, or an alloy of those materials is used for the second ferromagnetic layer 10, the nonmagnetic film 8b having a crystal separating function shown in FIG. 3 is not necessary. In this case, the magnetoresistive element becomes the same as that of the first embodiment shown in FIG. 1.

Example 2

A magnetoresistive element according to Example 2 is now described. The magnetoresistive element according to Example 2 is the same as that of Example 1, except that an artificial lattice such as a Co/Pt artificial lattice, a Co/Pd artificial lattice, a CoCr/Pt artificial lattice, a Co/Ru artificial lattice, a Co/Os artificial lattice, a Co/Au artificial lattice, or a Ni/Cu artificial lattice is used as the second ferromagnetic layer 10.

With one of those materials being used, the second ferromagnetic layer 10 has an axis of easy magnetization in the direction perpendicular to the film planes. Further, CoPd is used as the material of the first ferromagnetic layer 2. With this material being used, the first ferromagnetic layer 2 has an axis of easy magnetization in the direction perpendicular to the film planes.

In Example 2, the nonmagnetic films 4b and 8b need to be provided in the first and second interfacial magnetic layers 4 and 8, as shown in FIG. 3. An artificial lattice can adjust magnetic anisotropy energy density and saturation magnetization by adjusting the amount of the element to be added to a ferromagnetic film, and the film thickness ratio between the ferromagnetic film and a nonmagnetic film. Accordingly, in a case where the magnetic anisotropy energy density of the second ferromagnetic layer 10 is made higher than the magnetic anisotropy energy density of the CoPd of the first ferromagnetic layer 2, the structure of Example 2 becomes a so-called bottom-free structure. In a case where the magnetic anisotropy energy density of the second ferromagnetic layer 10 is made lower than the magnetic anisotropy energy density of the CoPd of the first ferromagnetic layer 2, the structure of Example 2 becomes a so-called top-free structure. Compositions are adjusted so that the interfacial magnetic films 4c and 8c and the interfacial magnetic films 4a and 8a can have stable BCC structures and stable FCC structures. In this manner, the same effects as those of Example 1 can be achieved with the mechanism specified in Example 1.

Example 3

A magnetoresistive element according to Example 3 is now described. The magnetoresistive element of Example 3 is the same as the magnetoresistive element of Example 1, except that one of FePt, FePd, and CoPt, or an alloy of those materials is used for the second ferromagnetic layer 10. The second ferromagnetic layer 10 in Example 3 has an axis of easy magnetization in the direction perpendicular to the film planes. Also, the first ferromagnetic layer 2 has an axis of easy magnetization in the direction perpendicular to the film planes.

In Example 3, the nonmagnetic films 4b and 8b needs to be provided in the first and second interfacial magnetic layers 4 and 8, as shown in FIG. 3. In a case where the magnetic anisotropy energy density of the one of FePt, FePd, and CoPt, or the alloy of those materials used for the second ferromagnetic layer 10 is made higher than the magnetic anisotropy energy density of the CoPd of the first ferromagnetic layer 2, the structure of Example 3 becomes a so-called bottom-free structure. In a case where the magnetic anisotropy energy density of the one of FePt, FePd, and CoPt, or the alloy of those materials used for the second ferromagnetic layer 10 is made lower than the magnetic anisotropy energy density of the CoPd of the first ferromagnetic layer 2, the structure of Example 3 becomes a so-called top-free structure. Compositions are adjusted so that the interfacial magnetic films 4c and 8c and the interfacial magnetic films 4a and 8a can have stable BCC structures and stable FCC structures. In this manner, the same effects as those of Example 1 can be achieved with the mechanism specified in Example 1.

Example 4

A magnetoresistive element according to Example 4 is now described. The magnetoresistive element according to Example 4 is the same as the magnetoresistive element 1A of the second embodiment shown in FIG. 2, except that an artificial lattice such as a Co/Pt artificial lattice, a Co/Pd artificial lattice, a CoCr/Pt artificial lattice, a Co/Ru artificial lattice, a Co/Os artificial lattice, a Co/Au artificial lattice, or a Ni/Cu artificial lattice is used as the second ferromagnetic layer 10, and one of FePt, FePd, and CoPt, or an alloy of those materials is used for the first ferromagnetic layer 2. The second ferromagnetic layer 10 has an axis of easy magnetization in the direction perpendicular to the film planes. The first ferromagnetic layer 2 has an axis of easy magnetization in the direction perpendicular to the film planes.

In Example 4, the nonmagnetic film 8b needs to be provided in the second interfacial magnetic layer 8, as shown in FIG. 2. An artificial lattice can adjust magnetic anisotropy energy density and saturation magnetization by adjusting the amount of the element to be added to a ferromagnetic film, and the film thickness ratio between the ferromagnetic film and a nonmagnetic film. Accordingly, in a case where the magnetic anisotropy energy density of the second ferromagnetic layer 10 is made higher than the magnetic anisotropy energy density of the one of FePt, FePd, and CoPt, or the alloy of those materials used for the first ferromagnetic layer 2, the structure of Example 4 becomes a so-called bottom-free structure. In a case where the magnetic anisotropy energy density of the second ferromagnetic layer 10 is made lower than the magnetic anisotropy energy density of the one of FePt, FePd, and CoPt, or the alloy of those materials used for the first ferromagnetic layer 2, the structure of Example 4 becomes a so-called top-free structure. Compositions are adjusted so that the interfacial magnetic film 8c and the interfacial magnetic film 8a can have a stable BCC structure and a stable FCC structure. In this manner, the same effects as those of Example 1 can be achieved with the mechanism specified in Example 1.

Example 5

Referring now to FIG. 2, a magnetoresistive element according to Example 5 is described. In Example 5, one of FePt, FePd, and CoPt, or an alloy of those materials is used for the first ferromagnetic layer 2, for example. As for the second ferromagnetic layer 10, CoPd is used.

In Example 5, the reference layer 2 is (001)-oriented in the direction perpendicular to the film planes. Therefore, a crystal separating layer may not be inserted into the first interfacial magnetic layer 4. However, the second interfacial magnetic layer 8 needs the nonmagnetic film 8b. In a case where the magnetic anisotropy energy density of the CoPd of the second ferromagnetic layer 10 is made higher than the magnetic anisotropy energy density of the one of FePt, FePd, and CoPt, or the alloy of those materials used for the first ferromagnetic layer 2, the structure of Example 5 becomes a so-called bottom-free structure. In a case where the magnetic anisotropy energy density of the CoPd of the second ferromagnetic layer 10 is made lower than the magnetic anisotropy energy density of the one of FePt, FePd, and CoPt, or the alloy of those materials used for the first ferromagnetic layer 2, the structure of Example 5 becomes a so-called top-free structure. Compositions are adjusted so that the interfacial magnetic film 8c and the interfacial magnetic film 8a can have a stable BCC structure and a stable FCC structure. In this manner, the same effects as those of Example 1 can be achieved with the mechanism specified above.

(Fourth Embodiment)

The MTJ elements 1, 1A, and 1B of the first through third embodiments can be applied to MRAMs. For ease of explanation, the MTJ element 1 of the first embodiment is used in the example case described below.

Each memory element forming a MRAM includes a recording layer that has a variable (invertible) magnetization (or spin) direction, a reference layer that has an invariable (fixed) magnetization direction, and a nonmagnetic layer interposed between the recording layer and the reference layer. One of the first ferromagnetic layer 2 and the second ferromagnetic layer 10 both having perpendicular magnetic anisotropy is used as a recording layer, and the other one is used as a reference layer. In this manner, a MRAM that uses the MTJ element 1 as a memory element can be formed.

Specifically, a difference in coercivity is provided between the first ferromagnetic layer 2 and the second ferromagnetic layer 10, so that the first ferromagnetic layer 2 and the second ferromagnetic layer 10 can be used as a recording layer and a reference layer. In the MTJ element 1, a ferromagnetic layer with a small inversion current is used as the first ferromagnetic layer 2 (the reference layer 2), and a ferromagnetic layer with a larger inversion current than that of the first magnetic layer is used as the second ferromagnetic layer 10 (the recording layer 10), for example. With this arrangement, the MTJ element 1 including the first interfacial magnetic layer 4 with a variable magnetization direction and the second interfacial magnetic layer 8 with a fixed magnetization direction can be realized.

Figure 6:
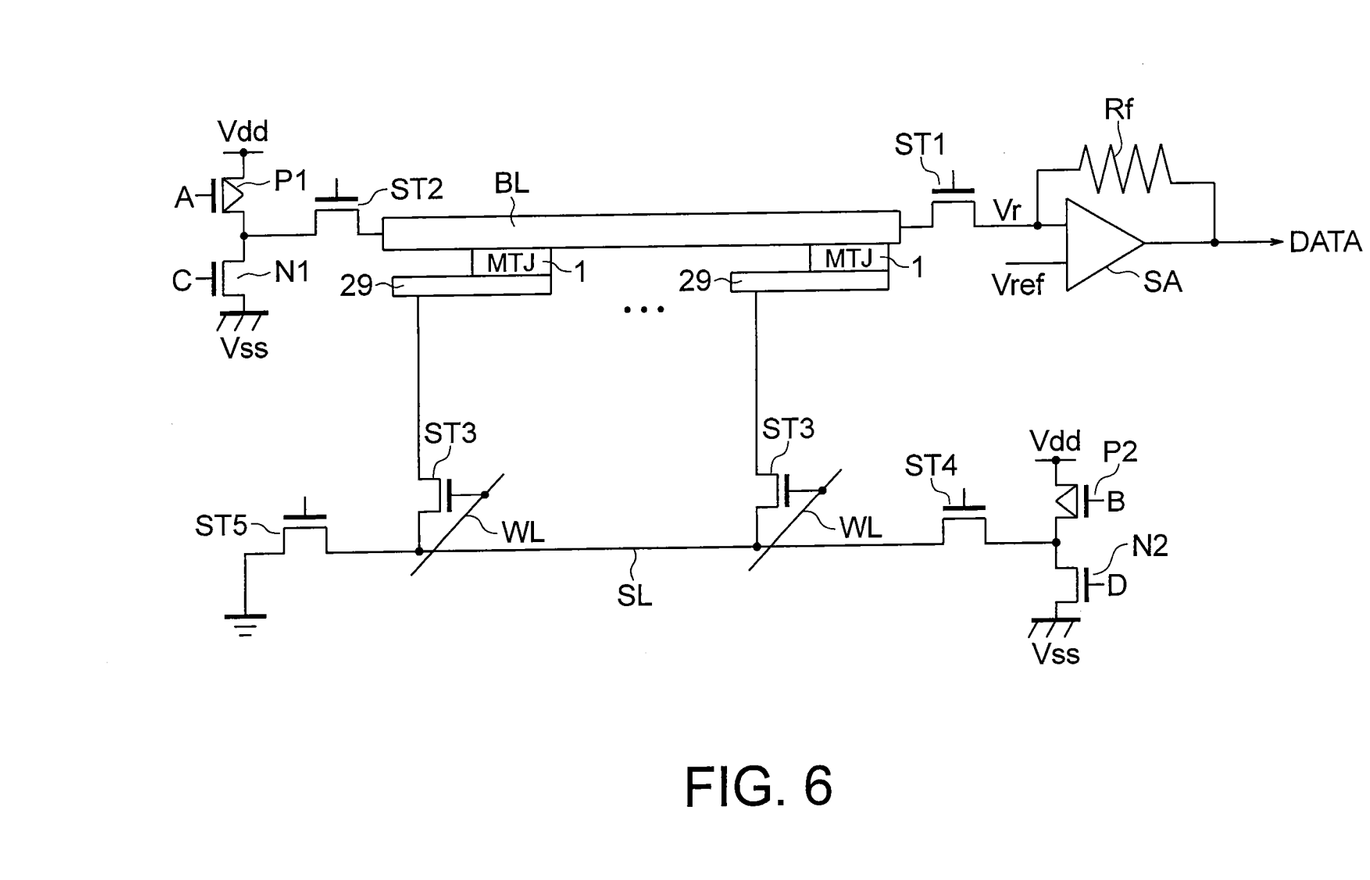
FIG. 6 is a circuit diagram showing an MRAM according to a fourth embodiment.

FIG. 6 is a circuit diagram showing the structure of a MRAM according to the fourth embodiment. The MRAM of this embodiment include memory cells arranged in a matrix fashion, and each of the memory cells has the MTJ element 1. One end of each MTJ element 1 is electrically connected to a bit line BL. One end of each bit line BL is electrically connected to a sense amplifier SA via an n-channel MOS transistor ST1 as a selecting switch. The sense amplifier SA compares a read potential Vr from each MTJ element 1 with a reference potential Vref, and outputs the result of the comparison as an output signal DATA. The resistor Rf electrically connected to the sense amplifier SA is a return resistor.

The other end of each bit line BL is electrically connected to the drain of a p-channel MOS transistor P1 and an n-channel MOS transistor N1 via an n-channel MOS transistor ST2 as a selecting switch. The source of the MOS transistor P1 is connected to a source terminal Vdd, and the source of the MOS transistor N1 is connected to a ground terminal Vss.

The other end of each MTJ element 1 is electrically connected to a lower electrode 29. Each lower electrode 29 is electrically connected to a source line SL via an n-channel MOS transistor ST3 as a selecting switch. It should be noted that the source line SL extends in a direction parallel to the bit line BL.

The source line SL is electrically connected to the drain of a p-channel MOS transistor P2 and the drain of an n-channel MOS transistor N2 via an n-channel MOS transistor ST4 as a selecting switch. The source of the MOS transistor P2 is connected to the source terminal Vdd, and the source of the MOS transistor N2 is connected to the ground terminal Vss. The source line SL is also connected to the ground terminal Vss via an n-channel MOS transistor ST5 as a selecting switch.

The gate of each MOS transistor ST3 is electrically connected to a word line WL. Each word line WL extends in a direction perpendicular to the direction in which each bit line BL extend.

Data writing into each MTJ element 1 is performed by a spin-injection write technique. That is, the MOS transistors P1, P2, N1, and N2 are switched on and off by control signals A, B, C, and D, so as to control the direction of a write current flowing in each MTJ element 1. In this manner, data writing is performed.

Data reading from each MTJ element 1 is performed by supplying a read current to each MTJ element 1. The read current is set at a smaller value than that of the write current. Each MTJ element 1 has a resistance value that depends on whether the magnetization directions of the reference layer and the recording layer are parallel or antiparallel due to a magnetoresistive effect. That is, when the magnetization directions of the reference layer and the recording layer are parallel, the resistance value of the MTJ element 1 becomes smallest, and, when the magnetization directions of the reference layer and the recording layer are antiparallel, the resistance value of the MTJ element 1 becomes largest. The changes in the resistance value are detected by the sense amplifier SA, to read the information recorded in the MTJ element 1.

Figure 7:
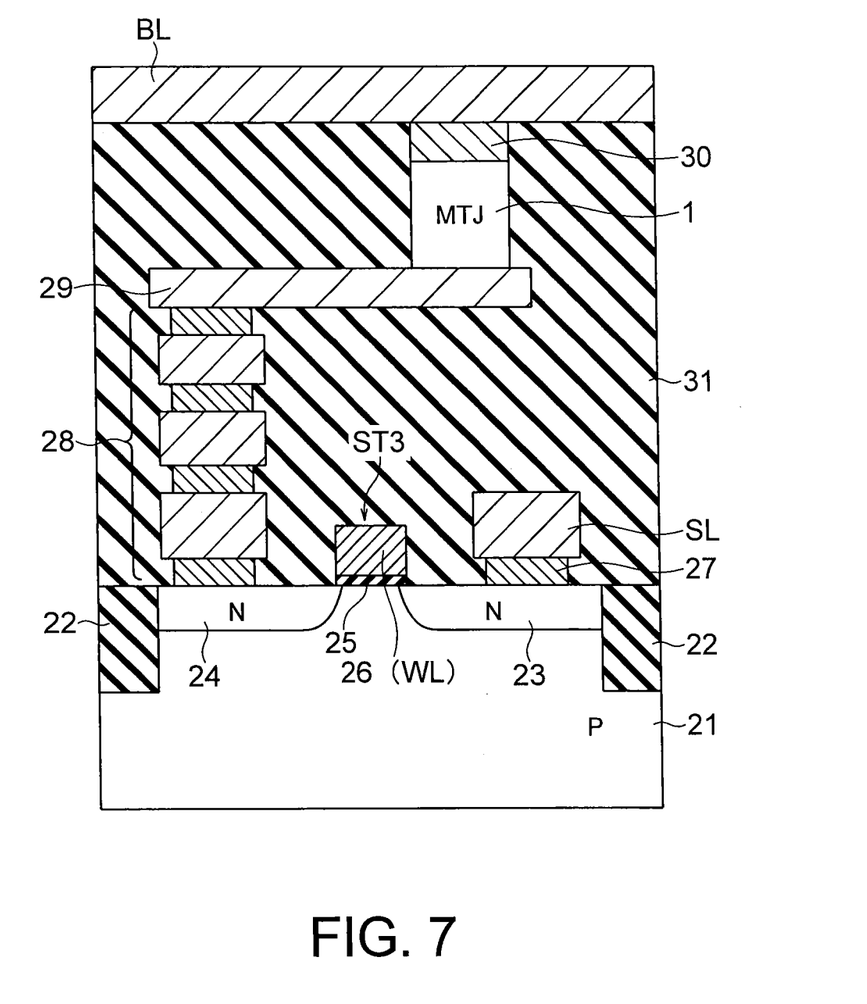
FIG. 7 is a cross-sectional view of a memory cell in the fourth embodiment.

FIG. 7 is a cross-sectional view showing one of the above described memory cells. In a p-type semiconductor substrate 21, a device isolation insulating layer 22 having a STI (shallow trench isolation) structure is formed. In each device region (each active region) surrounded by the device isolation insulating layer 22, the n-channel MOS transistor ST3 as a selecting switch is provided. The MOS transistor ST3 includes diffusion regions 23 and 24 as source/drain regions, a gate insulating film 25 placed on the channel region between the diffusion regions 23 and 24, and a gate electrode 26 placed on the gate insulating film 25. The gate electrode 26 is equivalent to each word line WL shown in FIG. 6.

A contact plug 27 is placed on the diffusion region 23. The source line SL is placed on the contact plug 27. A contact plug 28 is placed on the diffusion region 24. The lower electrode 29 is placed on the contact plug 28. The MTJ element 1 is placed on the lower electrode 29. An upper electrode 30 is placed on the MTJ element 1. The bit line BL is placed on the upper electrode 30. The space between the semiconductor substrate 21 and the bit line BL is filled with an interlayer insulating layer 31.

(Fifth Embodiment)

Figure 8:
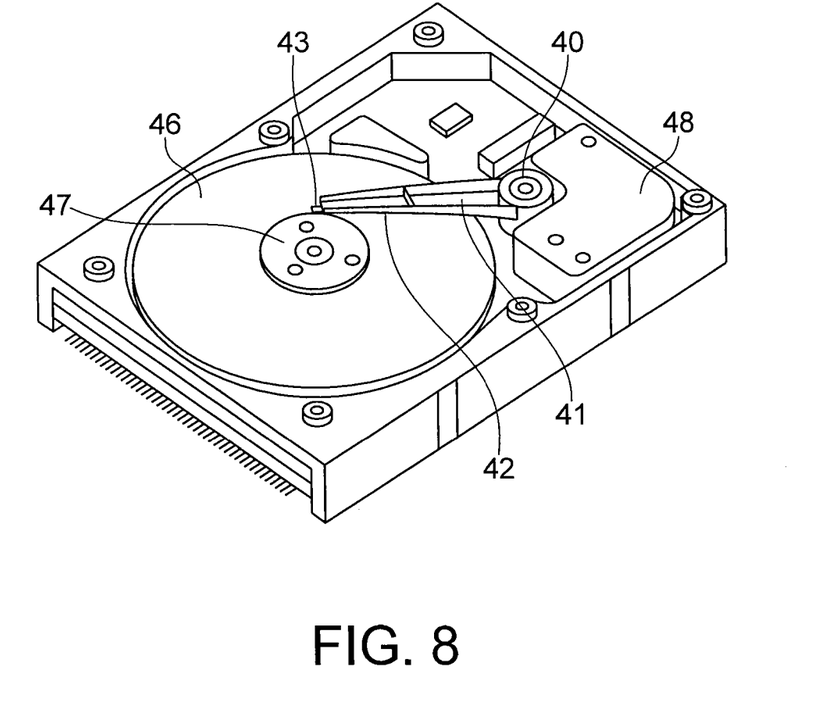
FIG. 8 is a schematic view showing the structure of a magnetic disk device according to a fifth embodiment.
Figure 9:
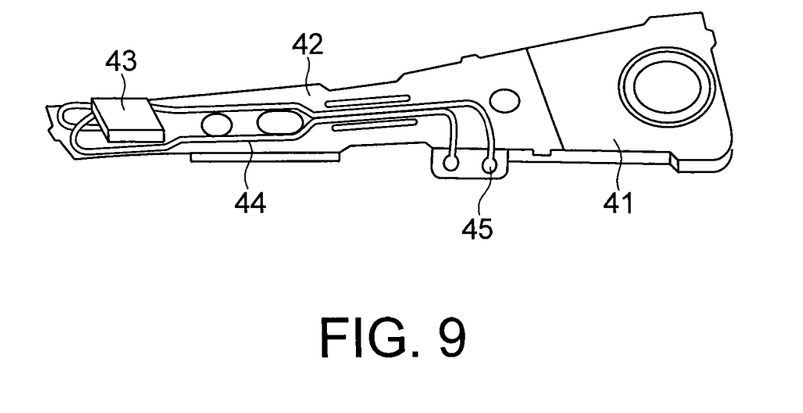
FIG. 9 is a schematic view showing the structure of a magnetic head assembly unit on which a TMR head is mounted.

Referring now to FIGS. 8 and 9, a magnetic disk device according to a fifth embodiment is described. FIG. 8 is a schematic view showing the structure of the magnetic disk device according to the fifth embodiment. FIG. 9 is a schematic view showing the structure of the magnetic head assembly unit on which a TMR head is mounted. An actuator arm 41 has a hole such that the actuator arm 41 is fixed to a fixed shaft 40 in the magnetic disk device. A suspension 42 is connected to one end of the actuator arm 41.

A head slider 43 having a TMR head mounted thereon is attached onto the top end of the suspension 42. Leads 44 for data writing/reading are set on the suspension 42. One end of each lead 44 is electrically connected to the electrode of the TMR head incorporated into the head slider 43. The TMR head includes the MTJ element of one of the first through third embodiments. For ease of explanation, an example case where the MTJ element 1 of the first embodiment is used is described. The other end of each lead 44 is electrically connected to an electrode pad 45.

A magnetic disk 46 is set around a spindle 47, and is driven by a motor in accordance with a control signal from a drive controller. By virtue of the rotation of the magnetic disk 46, the head slider 43 is lifted up by a predetermined amount. In this situation, data recording and reproduction is performed with the use of the TMR head.

The actuator arm 41 has a bobbin unit that holds a drive coil. A voice coil motor 48 that is a kind of linear motor is connected to the actuator arm 41. The voice coil motor 48 includes the drive coil wound up in the bobbin unit of the actuator arm 41, and a magnetic circuit formed by permanent magnets arranged on the opposite sides from each other to half-surround the drive coil, and an opposed yoke. The actuator arm 41 is held by ball bearings provided at two locations: an upper spot and a lower spot on the fixed shaft 40. The actuator arm 41 is driven by the voice coil motor 48.

Although a MRAM and a magnetic disk device have been described as examples to which the magnetoresistive elements of the first through third embodiments can be applied, those magnetoresistive elements can be applied to any other devices utilizing TMR effects.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetoresistive element comprising:
a first ferromagnetic layer having an axis of easy magnetization in a direction perpendicular to a film plane;
a second ferromagnetic layer having an axis of easy magnetization in a direction perpendicular to the film plane;
a tunnel barrier layer placed between the first ferromagnetic layer and the second ferromagnetic layer; and
a first interfacial magnetic layer placed between the first ferromagnetic layer and the tunnel barrier layer, the first interfacial magnetic layer including a first interfacial magnetic film which is $(Co_xFe_{100-x})_{100-z}B_z$ (x>75 atomic %, 0<z≤30 atomic %), a second interfacial magnetic film placed between the first interfacial magnetic film and the tunnel barrier layer and being $(Co_yFe_{100-y})_{100-w}B_w$ (y≤75 atomic %, 0<w≤30 atomic %), and a first nonmagnetic film placed between the first interfacial magnetic film and the second interfacial magnetic film and containing at least one element selected from the group consisting of Ta, W, Nb, V, Si, and Zr.

2. The element according to claim 1, further comprising:
a second interfacial magnetic layer placed between the second ferromagnetic layer and the tunnel barrier layer.

3. The element according to claim 2, wherein the second interfacial magnetic layer includes a third interfacial magnetic film which is $(Co_xFe_{100-x})_{100-z}B_z$ (x>75 atomic %, 0<z≤30 atomic %) a fourth interfacial magnetic film placed between third interfacial magnetic film and the tunnel barrier layer and being $(Co_yFe_{100-y})_{100-w}B_w$ (y≤75 atomic %, 0<w≤30 atomic %), and a second nonmagnetic film placed between the third interfacial magnetic film and the fourth interfacial magnetic film and containing at least one element selected from the group consisting of Ta, W, Nb, V, Si, and Zr.

4. The element according to claim 1, wherein the first ferromagnetic layer includes a multilayer structure in which a first alloy containing at least one element selected from the group consisting of Fe, Co, and Ni, and a second alloy containing at least one element selected from the group consisting of Cr, Pt, Pd, Ir, Rh, Ru, Os, Re, Au, and Cu are stacked.

5. The element according to claim 1, wherein the first ferromagnetic layer is an alloy containing at least one element selected from the group consisting of Fe, Co, and Ni, and at least one element selected from the group consisting of Cr, Pt, Pd, Ir, Rh, Ru, Os, Re, Au, and Cu.

6. The element according to claim 1, wherein the second ferromagnetic layer is an amorphous alloy containing at least one element selected from the group consisting of Fe, Co, Ni, Tb, Dy, and Gd.

7. The element according to claim 1, wherein the second ferromagnetic layer includes a multilayer structure in which a first alloy containing at least one element selected from the group consisting of Fe, Co, Ni, Tb, Dy, and Gd, and a second alloy containing at least one element selected from the group consisting of Fe, Co, Ni, Tb, Dy, and Gd are stacked.

8. The element according to claim 1, wherein the second ferromagnetic layer is an alloy containing at least one element selected from the group consisting of Fe, Co, Ni, and Cu, and at least one element selected from the group consisting of Pt, Pd, Rh, and Au.

9. The element according to claim 1, wherein a magnetization direction of the first ferromagnetic layer is changeable by a current flowing between the first ferromagnetic layer and the second ferromagnetic layer through the nonmagnetic layer, and a magnetization direction of the second ferromagnetic layer is not changeable by the current.

10. A magnetic memory comprising:
a memory cell including the magnetoresistive element according to claim 1;
a first wiring electrically connected to one of the first and second ferromagnetic layers; and
a second wiring electrically connected to the other one of the first and second ferromagnetic layers.

11. The memory according to claim 10, wherein the magnetoresistive element further comprises a second interfacial magnetic layer placed between the second ferromagnetic layer and the tunnel barrier layer.

12. The memory according to claim 11, wherein the second interfacial magnetic layer includes a third interfacial magnetic film which is $(Co_xFe_{100-x})_{100-z}B_z$ (x>75 atomic %, 0<z≤30 atomic %), a fourth interfacial magnetic film placed between third interfacial magnetic film and the tunnel barrier layer and being $(Co_yFe_{100-y})_{100-w}B_w$ (y≤75 atomic %, 0<w≤30 atomic %), and a second nonmagnetic film placed between the third interfacial magnetic film and the fourth interfacial magnetic film and containing at least one element selected from the group consisting of Ta, W, Nb, V, Si, and Zr.

13. The memory according to claim 10, wherein the first ferromagnetic layer includes a multilayer structure in which a first alloy containing at least one element selected from the group consisting of Fe, Co, and Ni, and a second alloy containing at least one element selected from the group consisting of Cr, Pt, Pd, Ir, Rh, Ru, Os, Re, Au, and Cu are stacked.

14. The memory according to claim 10, wherein the first ferromagnetic layer is an alloy containing at least one element selected from the group consisting of Fe, Co, and Ni, and at least one element selected from the group consisting of Cr, Pt, Pd, Ir, Rh, Ru, Os, Re, Au, and Cu.

15. The memory according to claim 10, wherein the second ferromagnetic layer is an amorphous alloy containing at least one element selected from the group consisting of Fe, Co, Ni, Tb, Dy, and Gd.

16. The memory according to claim 10, wherein the second ferromagnetic layer includes a multilayer structure in which a first alloy containing at least one element selected from the group consisting of Fe, Co, Ni, Tb, Dy, and Gd, and a second alloy containing at least one element selected from the group consisting of Fe, Co, Ni, Tb, Dy, and Gd are stacked.

17. The memory according to claim 10, wherein the second ferromagnetic layer is an alloy containing at least one element selected from the group consisting of Fe, Co, Ni, and Cu, and at least one element selected from the group consisting of Pt, Pd, Rh, and Au.

18. The memory according to claim 10, wherein a magnetization direction of the first ferromagnetic layer is changeable by a current flowing between the first ferromagnetic layer and the second ferromagnetic layer through the nonmagnetic layer, and a magnetization direction of the second ferromagnetic layer is not changeable by the current.

* * * * *